(12) United States Patent
Gregorius et al.

(10) Patent No.: US 7,817,766 B2
(45) Date of Patent: Oct. 19, 2010

(54) APPARATUS AND METHOD FOR AVOIDING STEADY-STATE OSCILLATIONS IN THE GENERATION OF CLOCK SIGNALS

(75) Inventors: Peter Gregorius, Munich (DE); Thomas Rickes, Munich (DE); Ralf Schledz, Zolling (DE); Martin Streibl, Petershausen (DE)

(73) Assignee: Qimonda AG, Munich (DE)

( * ) Notice: Subject to any disclaimer, the term of this patent is extended or adjusted under 35 U.S.C. 154(b) by 1024 days.

(21) Appl. No.: 11/554,554

(22) Filed: Oct. 30, 2006

(65) Prior Publication Data
US 2007/0133730 A1 Jun. 14, 2007

(30) Foreign Application Priority Data
Oct. 28, 2005 (DE) .................... 10 2005 051 773

(51) Int. Cl.
*H03D 3/24* (2006.01)
(52) U.S. Cl. ...................................... 375/375
(58) Field of Classification Search ........... 375/354, 375/362, 365, 371, 373, 375, 376; 327/141, 327/144, 146, 147, 149, 155, 156, 158, 162, 327/163
See application file for complete search history.

(56) References Cited

U.S. PATENT DOCUMENTS 6,839,860 B2 1/2005 Lin
6,950,487 B2 * 9/2005 Lin et al. .................... 375/376
7,046,058 B1 * 5/2006 Fang et al. .................. 327/158

FOREIGN PATENT DOCUMENTS

WO 02087086 10/2002

\* cited by examiner

*Primary Examiner*—David C Payne
*Assistant Examiner*—Vineeta S Panwalkar
(74) *Attorney, Agent, or Firm*—Patterson & Sheridan, LLP (57) ABSTRACT

A digital control loop and a method for clock generation. A control loop includes at least one phase detector configured to detect a phase shift of a feedback signal relative to a reference clock signal and output a correction signal on the basis of the phase shift detected. At least one control loop filter is configured to output, on the basis of the correction signal, a first control signal and a second control signal, the first control signal being substantially the same as the second control signal except that oscillations are suppressed in the second control signal. At least one first phase generator is configured to output a first clock signal on the basis of the first control signal and the first phase reference signal, wherein the first clock signal is transmitted at least partially as feedback signal to the phase detector. At least one second phase generator receives the second control signal and the first phase reference signal, wherein the second phase generator is functionally substantially the same as the first phase generator and is configured to output a second clock signal on the basis of the second control signal and the first phase reference signal.

20 Claims, 3 Drawing Sheets

APPARATUS AND METHOD FOR AVOIDING STEADY-STATE OSCILLATIONS IN THE GENERATION OF CLOCK SIGNALS

CROSS-REFERENCE TO RELATED APPLICATIONS

This application claims foreign priority benefits under 35 U.S.C. §119 to co-pending German patent application number DE 10 2005 051 773.0, filed 28 Oct. 2005. This related patent application is herein incorporated by reference in its entirety.

BACKGROUND OF THE INVENTION

1. Field of the Invention

The invention relates to a digital control loop and a method for generating clock signals with a high phase stability.

2. Description of the Related Art

To generate clock signals in integrated circuits, a multiplicity of clock signals having different phase angles relative to one another is often needed. Analog or digital control loops are used for phase generation and phase control in fast serial data transmission.

Figure 4A:
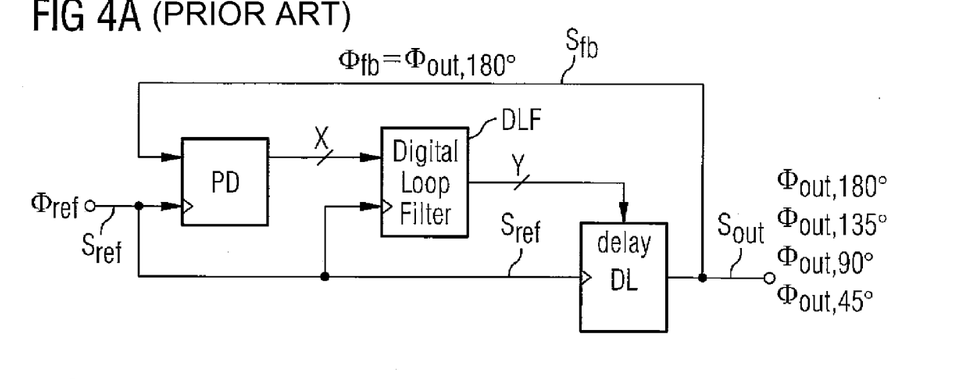
FIGS. 4A-4C show conventional control loops for clock generation.

FIG. 4A shows a conventional digital control loop which achieves phase generation, i.e. the generation of clock signals with different phase angles with respect to one another, by using a digitally controlled delay line DL. The control loop consists of a phase detector PD, a digital loop filter DLF and the digitally controlled delay line DL. Starting with a reference clock signal $S_{ref}$ having a phase $\Phi_{ref}$, the delay line DL generates by means of propagation time delay a new clock signal $S_{out}$ which usually consists of a number of individual phase signals which are provided via individual electrical lines and have different phase shifts relative to the reference clock signal $S_{ref}$. The individual phase signals, in turn, are oscillation signals which are output as phase-shifted clock signals. Typical phase shifts for the individual clock signals with respect to the reference phase $\Phi_{ref}$ are 45°, 90°, 135° and 180°.

To keep the relative phase angle of the generated clock signal $S_{out}$ or of the individual phase signals, respectively, constant, the control loop has a feedback path. In this arrangement, a part of the clock signal $S_{out}$, as feedback signal $S_{fb}$, is compared with the reference clock signal $S_{ref}$ by means of the phase detector PD. The feedback signal $S_{fb}$ used is often the 180° phase signal of the clock signal $S_{out}$ generated. Depending on the relative phase angle between the reference clock signal $S_{ref}$ and the generated clock signal $S_{out}$, the phase detector PD outputs a digital correction signal X. This, in most cases binary, correction signal X is transferred to the digital loop filter DLF which generates a digital control signal Y. The control signal Y is several bits wide in most cases and it is also called control word Y. The control word Y is transferred to the delay line DL and controls the delay time effected in the digital delay line DL. The result of this postregulation of the delay time is that the phase angle remains constant over a long period.

Figure 4B:
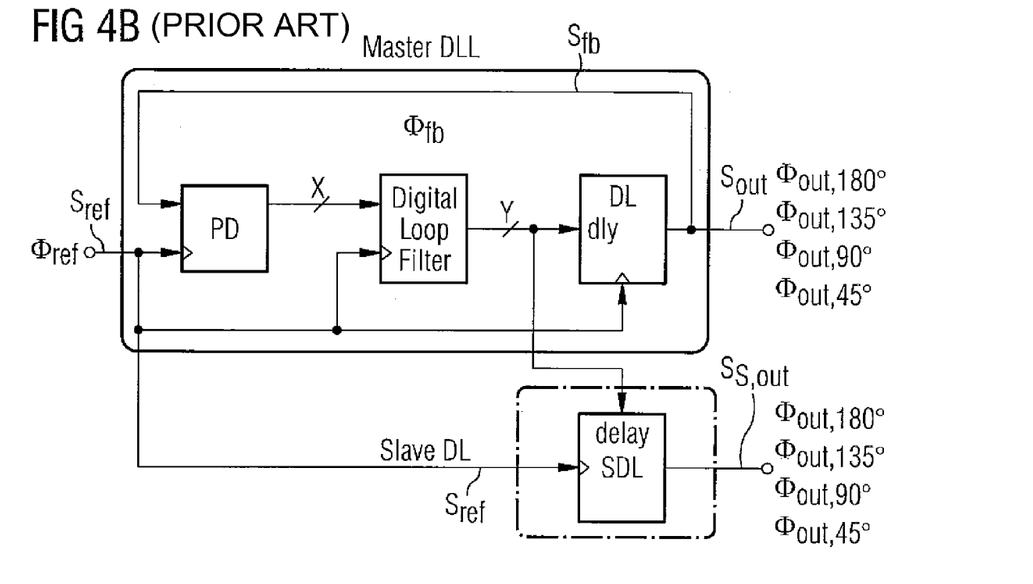

For the local phase generation, the digital control signal Y generated by the control loop can now be used several times. As shown in FIG. 4B, the control signal, together with the reference clock signal $R_{ref}$, is transferred to a number of slave delay lines SDL distributed over a chip. These then generate the phases needed locally. This makes it possible to dispense with a more elaborate distribution of all phase signals over large distances which would entail considerable matching problems. Instead, only the reference clock signal $S_{ref}$ and the control signal Y need to be distributed over relatively large distances. The phase angle is regulated via the master delay-locked loop (Master DLL).

To regulate the phase angle, the phase detector PD usually generates a binary correction signal X, i.e. it generates an early/late information item in the form of digital pulses in dependence on the relative phase angle of the feedback signal in comparison with the reference clock signal. Due to the principle involved, such a phase detector PD combined with an integrating loop filter requires in the case of a constant reference phase $\Phi_{ref}$ an oscillation of the feedback phase $\Phi_{fb}$ in the steady state so that the number of "early" and "late" information items of the correction signal X remains constant in the temporal mean. The associated oscillation of the correction signal X, in turn, leads to an oscillation of the control word Y between two values and thus, in turn, to oscillations of the output phases or of the phase signals generated, respectively. This corresponds to an inherent noise of the control loop.

Figure 4C:
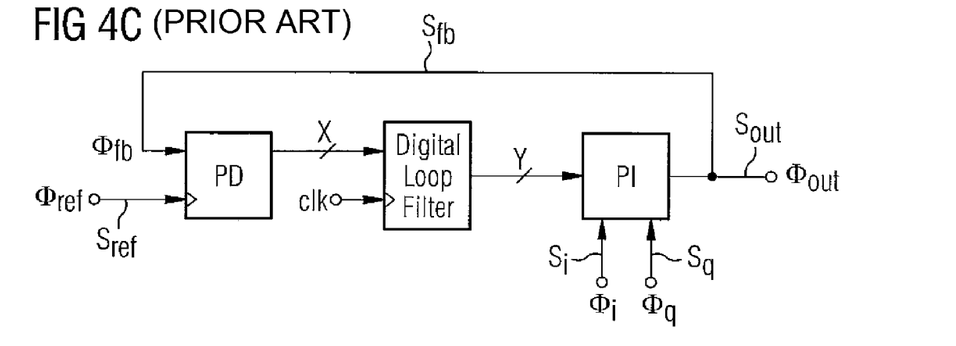

FIG. 4C shows a conventional control loop which comprises a phase interpolator PI as a further possibility for generating clock signals with certain or determinable phase angles. This phase interpolator is supplied with a first phase reference signal $S_i$ and a second phase reference signal $S_q$. Depending on the control signal Y received, the phase interpolator PI outputs a clock signal $S_{out}$, the phase $\Phi_{out}$ of which is between the phase $\Phi_i$ of the first phase reference signal $S_i$ and the phase $\Phi_q$ of the second phase reference signal $S_q$. The exact relative phase angle is controlled or determined by the control word Y. The control signal Y is generated analogously to the examples shown previously.

Using phase interpolators makes it possible to achieve even finer gradings in the relative phase angle.

As a result, however, fluctuations or oscillations in the relative phase angle have even more severe effects on the ability to distinguish the individual clock signals. Particularly when a number of control loops are connected in cascade in order to achieve, for example, firstly a coarse grading of the phases by means of delay lines and, on the basis of the clock signals obtained during this process, a finer grading of the phase angle by means of phase interpolators, oscillations can accumulate in the phase of the clock signals. As a result, the fineness of the grading for still distinguishable phase angles is restricted to a minimum grading which must be greater than the amplitude of the oscillations of the phase angles.

SUMMARY OF THE INVENTION

It is the object of the present invention to provide a digital control loop and a method for clock generation by means of which an improved stability of the phase angle of a generated clock signal is achieved.

According to the present invention, a digital control loop for clock generation is thus provided which comprises:
  at least one phase detector which has at least one reference clock signal input for receiving a reference clock signal, particularly a clock signal, a feedback input for receiving a feedback signal and a correction signal output, the phase detector being designed for detecting a phase shift of the feedback signal relative to the reference clock signal and outputting at the correction signal output a correction signal in dependence on the phase shift detected;
  at least one control loop filter which has a signal connection to the correction signal output of the phase detector via a correction signal input for receiving the correction signal, the control loop filter being designed for outputting, in dependence on the correction signal, a first control signal via a first control output and a second control signal, which differs from the first control signal essentially in that oscillations are suppressed in the second control signal, via a second control output;

at least one first phase generator which has at least one control input for receiving the first control signal and at least one first phase reference input for receiving a first phase reference signal, wherein the first phase generator is designed for outputting a first clock signal, in dependence on the first control signal and on the first phase reference signal via a first clock signal output, wherein the first clock signal output has a signal connection at least partially to the feedback input of the phase detector and the first clock signal is transmitted at least partially as feedback signal to the phase detector; and at least one second phase generator which has at least one control input for receiving the second control signal and at least one first phase reference input for receiving the first phase reference signal, wherein the second phase generator is essentially functionally identical to the first phase generator and is designed for outputting a second clock signal in dependence on the second control signal and on the first phase reference signal via a second clock signal output.

The control loop according to one embodiment of the invention is thus designed for receiving a periodic first phase reference signal which is preferably a clock signal of a digital circuit and outputting a first and a second periodic clock signal. In this arrangement, the first and the second clock signal essentially have the same frequency as the first phase reference signal. The reference clock signal provided at the reference clock signal input is also preferably a clock signal of a digital circuit and also has essentially the same frequency. The reference clock signal and/or reference clock signal used is preferably at least partially a clock signal which was generated by a preceding control loop according to the present invention.

The reference clock signal and/or the first phase reference signal is in a particularly preferred manner an essentially rectangular periodic voltage signal. The first and the at least one second phase generator is most preferably designed for outputting the first and second clock signal, respectively, as rectangular periodic voltage signal. The reference clock signal, the first phase reference signal and the first and the second clock signal essentially preferably have the same shape. The periodic signals preferably only differ from one another in their relative phase angle. In this context, the relative phase angle or phase of the first and of the second clock signal with respect to the phase of the phase reference signal and/or of the reference clock signal is controlled or set by the first and second phase generator in dependence on the first and second control signal, respectively.

In particular, the relative phase angle of the first and second clock signal, respectively, with respect to the first phase reference signal is influenced via the first and second control signal, respectively. In this context, the second phase generator is essentially functionally identical to the first phase generator. This means that the phase generators, when receiving identical control signals, produce an essentially identical relative phase angle of the first and second clock signal, respectively, with respect to the first phase reference signal. With similar control signals, the phase generators preferably generate similar phase angles of the clock signals relative to the first phase reference signal. This is preferably achieved by the fact that the second phase generator is constructed essentially identically to the first phase generator. "Essentially" identical in this context means that it is not necessarily the spatial arrangement of individual electronic components be identical, but that preferably at least the electrical interconnection of the individual components or functional components is identical.

Since, according to the invention, the second control signal generated by the control loop filter essentially differs from the first control signal in that oscillations, and particularly oscillations of the control signal between two values, are suppressed in the second control signal, the essentially functionally identical arrangement of the at least two phase generators has the result that the second clock signal preferably essentially differs from the first clock signal in that oscillations are suppressed in the second clock signal. Thus, in a particular embodiment the first clock signal and the second clock signal are identical signals, with the exception of the oscillations being suppressed in the second clock signal. Whereas the first clock signal is at least partially used as feedback signal in the control loop of the control loop according to an embodiment of the invention, the second clock signal can be preferably used for further processing in a digital circuit or for controlling the switching processes in a digital circuit, respectively. The first clock signal, in contrast, is preferably only used for providing the feedback signal.

Due to the separate clock generation in the first phase generators (master generator) and the second phase generators (slave generator), a clock signal having a stable phase angle, namely the second clock signal, can be generated without disadvantageously influencing the control characteristic by additional damping in the control loop.

The control loop filter preferably comprises a digital loop filter which can be designed analogously to a digital loop filter of conventional control loops for clock generation and is essentially used for generating the first control signal. The control loop filter preferably comprises damping means in order to generate the second control signal on the basis of the first control signal, wherein oscillations present in the first control signal are damped. The damping means thus preferably essentially have the function of a low-pass filter. The damping characteristic of the damping means is in this case preferably matched to the control characteristic of the control loop and/or to the required precision of the phase angle of the second clock signal.

According to an embodiment of the present invention, steady-state oscillations of the generated clock signals are thus damped at the level of the digital control signals. In this process, oscillations of the phase angle of a clock signal to be generated are suppressed in that oscillations of the control signal are damped.

The phase detector is preferably designed for outputting a binary correction signal. The two values which can be assumed by the correction signal preferably in each case represent an early and late information item for the phase angle of the feedback signal compared with the reference clock signal. The two values of the correction signal are thus preferably a measure of whether the phase difference is greater than or less than a predetermined or determinable nominal value.

The control loop preferably comprises a multiplicity of further phase generators, all of which are designed analogously to the second phase generators and are controlled via the second control signal like these. These further phase generators can be used distributed over a chip for local phase generation. All phase generators are preferably constructed essentially identically.

The reference clock signal from the first and from the at least one second phase generator is preferably received as first phase reference signal. Thus, the first phase reference input of the first phase generator and the first phase reference input of the at least one second phase generator preferably have a signal connection to the reference clock signal input of the phase detector.

In a preferred embodiment, the first and the at least one second phase generator in each case comprises at least one first and at least one second delay line, respectively, which is designed for generating the first and at least one second clock signal, respectively, at least partially by delaying the first phase reference signal by a phase determined by means of the first and second control signal, respectively.

The first phase reference input of the first and the second delay line thus preferably in each case has a direct signal connection to the reference clock signal input of the phase detector. The first and the second clock signals preferably correspond to a first phase reference signal shifted by a phase dependent on the control signal.

The first and/or second clock signal output preferably comprises a multiplicity of phase outputs and the first and second clock signal, respectively, comprises a multiplicity of essentially periodic phase signals in such a manner that the individual phase signals are shifted with respect to one another by a certain or determinable phase difference and each phase signal is output via a phase output. The clock signal outputs thus preferably in each case comprise a multiplicity of electrical lines or a multiplicity of individual electrical outputs, respectively, via which a phase signal is output in each case. The clock signals in each case preferably comprise four phase signals, i.e. the phase signal outputs preferably in each case comprise at least four phase outputs. The individual phase signals preferably form in this case phase reference signals which are shifted by certain or determinable phases. The phase signals are preferably shifted with respect to the first phase reference signal by 45°, 90°, 135° or 180°, respectively. From the first clock signal, the 180° phase is especially preferably used as feedback signal. The clock signals can also comprise more phase signals which, in particular, have a finer subdivision or grading of the phase shifts, for example by 22.5°.

The first and the at least one second phase generator preferably in each case has a second phase reference input for receiving a second phase reference signal and in each case comprises at least one first and at least one second phase interpolator, respectively, which is designed for generating the first and at least one second clock signal, respectively, in such a manner that its phase is at an angle, determined by the first and second control signal, respectively, between the phases of the first and the second phase reference signal. The clock signal generation is thus preferably effected by means of phase interpolation. In this arrangement, conventional digitally controlled phase interpolators can be used in a familiar manner together with the present invention.

The control loop filter preferably comprises
at least one latch device with a data input for receiving the first control signal, a data output for outputting the second control signal, and an activation input for receiving an activation signal, by means of which the latch device is placed into an activated or a deactivated state, wherein the latch device
outputs the first control signal in the activated state and
outputs the value of the first control signal immediately before deactivation of the latch device in the deactivated state; and
at least one oscillation detector which is designed for detecting oscillations of the correction signal and outputting at a detector output, in dependence on the oscillations detected, a detection signal which is transmitted to the latch device as activation signal.

For this purpose, the oscillation detector preferably has a correction signal input for receiving the correction signal. In received correction signals, successive bits are preferably compared with one another and as a result, oscillations are detected in the correction signal. Depending on the number of bits compared with one another in the correction signal, the wavelength or the length of the oscillations can be determined. If the oscillation detector detects a periodic bit rate which preferably has the same number of "high" bits as "low" bits on average, the latch device is deactivated via the detection signal or activation signal, respectively, so that the control signal generated in the last activated state of the latch device is preferably stored in the latch device and is output as constant second control signal. The steady-state oscillations in the correction signal are thus not transferred to the second control signal and thus also not to the second clock signal. It is only when the oscillation detector detects a deviation of the periodic oscillation and particularly the predominance of "high" or "low" bits that the latch device is activated and a new second control signal is output for correcting the phase angle. As soon as a steady state is obtained again, i.e. the correction signal only exhibits steady-state oscillations, the second control word or control signal is preferably frozen again.

An embodiment of the invention also provides a method for clock generation which comprises the following steps:
providing a reference clock signal;
detecting a phase shift between the reference clock signal and a feedback signal;
generating a correction signal in dependence on the phase shift detected;
generating at least one first control signal and at least one second control signal in dependence on the correction signal, wherein the at least one second control signal essentially differs from the first control signal in that oscillations are suppressed in the at least one second control signal;
providing at least one first phase reference signal;
generating a first clock signal, the phase of which, relative to the phase of the first phase reference signal, depends on the first control signal and is used as reference clock signal; and
generating a second clock signal, the phase of which, relative to the phase of the first phase reference signal, depends on the second control signal, wherein the steps of generating the first clock signal and the second clock signal are carried out as essentially identical method steps.

Preferably, a clock signal of a digital circuit is provided as reference clock signal. Preferably, a binary signal is output as correction signal. Also preferably, the reference clock signal is used as first phase reference signal.

The first and/or second clock signal particularly preferably comprises a multiplicity of essentially periodic phase signals in such a manner that the individual phase signals are shifted with respect to one another by a certain or determinable phase difference and each phase signal is output on a separate phase line.

In one embodiment, the first and at least one second clock signal, respectively, is at least partially generated by delaying the first phase reference signal by means of a first and at least one second delay line, respectively, by a phase determined by means of the first and second control signal, respectively.

In a further preferred embodiment, the method also comprises a step of providing at least one second phase reference signal, wherein the first and the at least one second clock signal is generated by means of a first and at least one second phase interpolator, respectively, in such a manner that its phase is at an angle, determined by the first and second control signal, respectively, between the phases of the first and the second phase reference signal.

The method particularly preferably also comprises the steps:
detecting oscillations of the correction signal;
transmitting an activation signal to a latch device in dependence on the detected oscillations, wherein, in the step of generating the second clock signal, the first control signal is transferred to the latch device and the latch device is placed into an activated or a deactivated state in dependence on the activation signal, wherein the latch device outputs the first control signal in the activated state and outputs the value of the first control signal immediately before deactivation of the latch device in the deactivated state as second clock signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
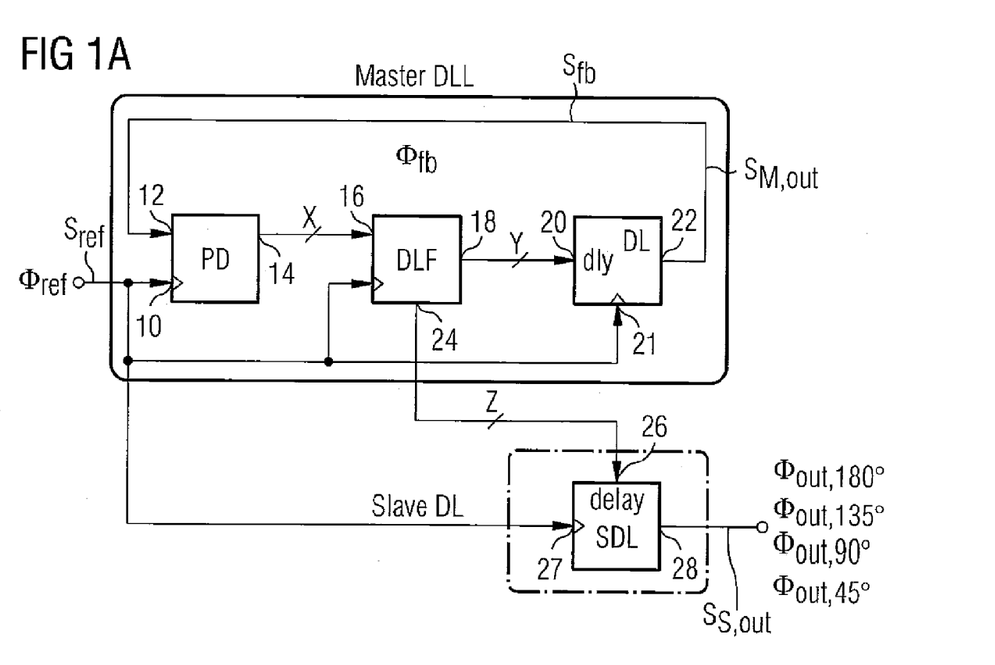
FIG. 1A shows a first preferred embodiment of the present invention.

FIG. 1A shows the first preferred embodiment of the present invention. In this arrangement, a phase detector PD is supplied with a reference clock signal $S_{ref}$ having a phase angle or phase $\Phi_{ref}$ via a reference clock signal input 10. At the same time, the phase detector PD receives via a feedback input 12 a feedback signal $S_{fb}$, the phase $\Phi_{fb}$ of which it compares with the reference phase $\Phi_{ref}$. In dependence on the relative phase angle, the phase detector PD outputs a preferably binary correction signal X via a correction signal output 14. The phase detector PD preferably comprises an edge-controlled flip flop circuit. In this arrangement, a "high" or "low" signal, which represents an "early" or "late" information item, is output at the correction signal output 14 in dependence on the relative position in time of the edges of the reference clock signal $S_{ref}$ and of the feedback signal $S_{fb}$. However, it is also conceivable to use a correction signal having a number of bits and thus providing a finer grading of the "early/late" information item.

The correction signal X is transferred to a control loop filter DLF and is supplied via a correction signal input 16. The control loop filter DLF generates, in dependence on the correction signal X received and preferably by taking into consideration its variation with time, a first digital control signal Y which it outputs via a first control output 18. For this purpose, the control loop filter DLF comprises, for example, a conventional digital loop filter.

In the first embodiment shown in FIG. 1A, the first control signal or control word Y is transferred to a first delay line DL. The first delay line DL receives the digital control signal Y via a control input 20. In addition, the first delay line DL has a first phase reference input 21 via which it receives the reference clock signal $S_{ref}$. The reference clock signal $S_{ref}$ thus forms a first phase reference signal. The first delay line DL preferably has a multiplicity of delay stages by means of which the received reference clock signal $S_{ref}$ is delayed due to the propagation time of the signal for the individual delay stages, and is thus shifted in its phase. Picking up the signal after the individual delay stages preferably connected in cascade provides a multiplicity of phase signals which are preferably provided in parallel at a first clock signal output 22 as the first clock signal $S_{out}$. Preferably, one of these signals output simultaneously, and particularly preferably the phase signal shifted by 180° with respect to the reference clock signal $S_{ref}$, is transferred as feedback signal to the feedback input 12 of the phase detector PD. Thus, the phase angle of the first clock signal $S_{out}$ is controlled via this closed control loop similarly to conventional control loops for clock generation. Differently from conventional control loops, however, the first clock signal $S_{out}$ is preferably not used as clock signal for controlling digital circuits in the present invention but is only used as feedback signal $S_{fb}$ for the control loop. The phase detector PD, the control loop filter DLF and the first phase generator or the first delay line DL together form a master delay-locked loop (Master DLL).

To generate a clock signal which is used for controlling other digital circuits, the control loop filter DLF has a second control output 24 via which it outputs a second control signal Z. This second control signal Z essentially differs from the first control signal Y in that, in particular, the oscillations of the first control signal Y occurring in the steady state of the control loop are suppressed in the generation of the second control signal Z. In particular, the second control signal Z is preferably essentially constant in the steady state. The second control signal Z is transferred to a control input 26 of a second delay line SDL (slave delay line). This slave delay line SDL is preferably essentially identical in construction to the master delay line DL (first delay line). Thus, the second delay line SDL also has a first phase reference input 27 and, analogously to the first delay line DL, generates a second clock signal $S_{S,out}$ at a second clock signal output 28 on the basis of the received reference clock signal $S_{ref}$ and controlled by the second control signal Z. Like the first clock signal $S_{M,out}$ the second clock signal $S_{S,out}$ also preferably comprises a multiplicity of individual phase signals which can be used as clock signals for controlling other digital circuits, and have a certain or determinable grading of the relative phase angles with respect to one another. Preferably, relative phase angles of 45°, 90°, 125° and 180° are generated here in this process. The corresponding phase signals are preferably output via parallel outputs which, together, form the second clock signal output 28.

To avoid phase oscillations of the clock signal $S_{S,out}$ to be provided, the clock signals $S_{S,out}$ used and the feedback signal $S_{fb}$ are decoupled from one another as described. The two delay lines, which may otherwise be identical in construction, are driven by different control words.

Figure 1B:
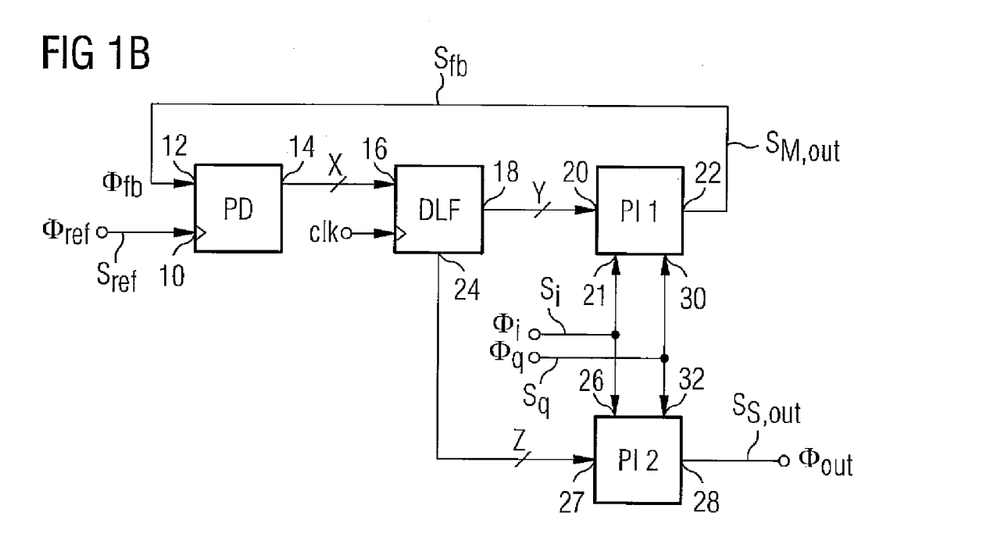
FIG. 1B shows a second preferred embodiment of the present invention.

FIG. 1B shows a second embodiment of the present invention. In this embodiment, phase interpolators PI1 and PI2 are used as phase generators instead of delay lines DL and SDL. Apart from the first phase reference input 21, 26, the phase interpolators in each case have a second phase reference input 30, 32 via which they receive a second phase reference signal $S_q$. The phase angle of the generated clock signals $S_{M,out}$ and $S_{S,out}$ is orientated with respect to the two phase reference signals $S_i$ and $S_q$. In particular, an output phase $\Phi_{out}$ is in each case generated which is between the phases $\Phi_i$ of the first and $\Phi_q$ of the second phase reference signal. As in the first embodiment, the precise angle of the phase of the first $S_{M,out}$ and the second clock signal $S_{S,out}$ is controlled via the first Y and the second control signal Z. The generation of the control signals just as the control by feedback is analogous to the first embodiment. Thus, in this second embodiment, too, a second control signal Z is preferably achieved which is preferably essentially constant in the steady state. Thus, the phase angle of the second clock signal is also essentially constant in the steady state and, in particular, does not have any or at least very much lower oscillations than has been normal in control loops according to the prior art.

Figure 2:
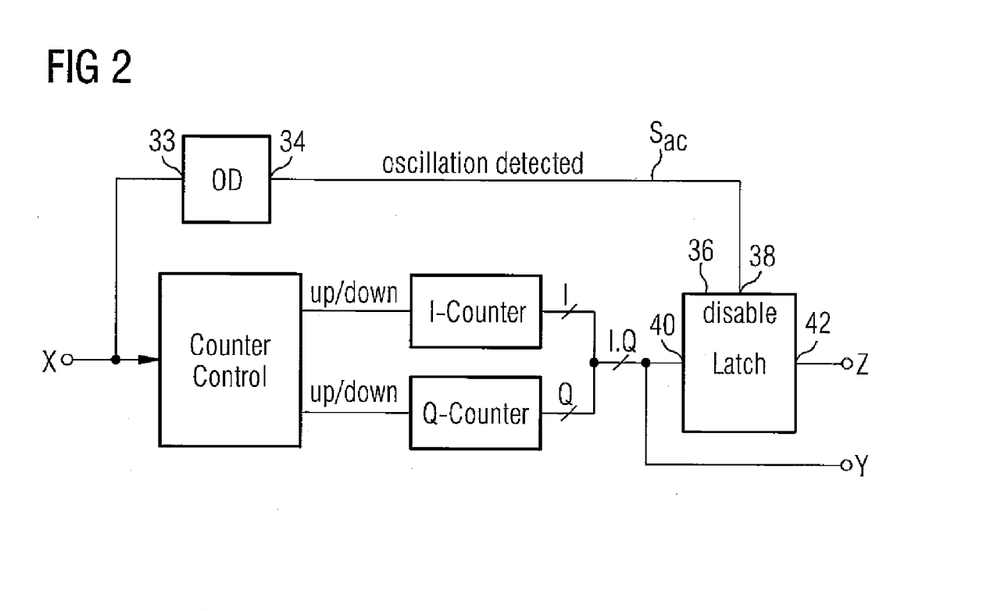
FIG. 2 shows a control loop filter according to a preferred embodiment of the present invention.

FIG. 2 shows a control loop filter according to a preferred embodiment of the present invention. This control loop filter comprises a conventional loop filter based on a counter control system which generates a first control signal Y from the correction signal X in a familiar manner. In addition, the control loop filter comprises an oscillation detector OD which receives the correction signal X via a detector input 32 and detects oscillations in the correction signal X. Depending on whether the oscillation detector OD, apart from a periodic oscillation of the correction signal X that occurs in the steady state of the control loop, also detects a non-periodic component, the oscillation detector OD outputs at a detector output 34 a detection signal which is transferred as activation signal $S_{ac}$ to a latch device 36 which receives the activation signal $S_{ac}$ at an activation input 38. The detection signal is preferably a binary signal which is directly able to activate or deactivate the latch device 36.

The latch device 36 receives the first control signal Y via a data input 40. If the latch device 36 is activated, the first control signal Y is preferably output directly as second control signal Z at a data output 42. If, in contrast, the correction signal X does not have a non-periodic component but only oscillations which cause the oscillation detector to deactivate the latch device 36 via the activation signal, the value of the first control signal Y last transmitted remains stored in the latch device 36 and is provided as constant value for the second control signal Z at the data output 42 until the latch device is activated again. This prevents oscillations of the second control signal $S_{S,out}$.

Figure 3:
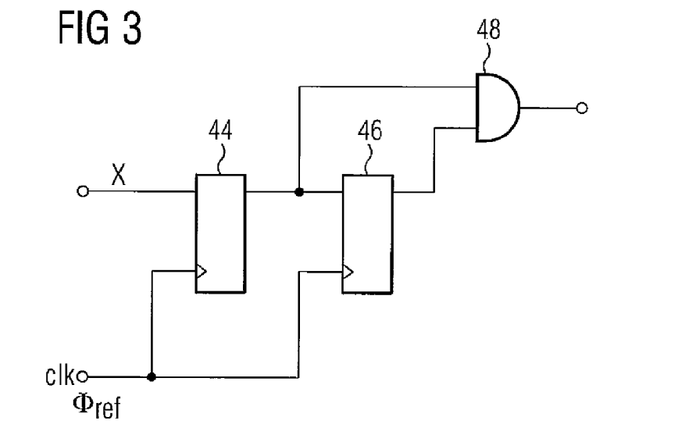
FIG. 3 shows an oscillation detector.

FIG. 3 shows a preferred embodiment of an oscillation detector OD as preferably used in the control loop filter shown in FIG. 2. The oscillation detector OD comprises a first flip flop circuit 44 and a second flip flop circuit 46 through which the received correction signal X is passed bit by bit preferably with each rise or fall in the clock signal. As a result, successive bits in the correction signal X can be compared with one another, for example, by means of an AND gate 48. If two identical bits follow one another in the correction signal X, the AND gate 48 outputs a signal which can be transferred as activation signal $S_{ac}$ to the latch device 36. In deviation from this embodiment shown, a longer bit chain of the correction signal can also be evaluated in accordance with the same principle by using a multiplicity of cascade-connected flip flop circuits.

In addition, it is also possible by means of the present invention to allocate to a single master delay-locked loop a multiplicity of second phase generators (slaves), all of which are controlled by the same second control word (Z). All these second phase generators are preferably functionally identical and, in particular, essentially identical in construction to the first phase generator used in the master delay-locked loop.

While the foregoing is directed to embodiments of the present invention, other and further embodiments of the invention may be devised without departing from the basic scope thereof, and the scope thereof is determined by the claims that follow.

LIST OF REFERENCE DESIGNATIONS

10 Reference signal input
12 Feedback input
14 Correction signal output
16 Correction signal input
18 First control output
20 Control input of the first phase generator
21 First phase reference input of the first phase generator
22 First clock signal output
24 Second control output
26 Control output of the second phase generator
27 First phase reference input of the second phase generator
28 Second clock signal output
30 Second phase reference input of the first phase generator
32 Second phase reference input of the second phase generator
33 Detector input
34 Detector output
36 Latch device
38 Activation input
40 Data input
42 Data output
44 First flip flop circuit
46 Second flip flop circuit
48 AND gate
DLF Control loop filter
PD Phase detector
DL First delay line
SDL Second delay line
PI1 First phase interpolator
PI2 Second phase interpolator
$S_{ref}$ Reference clock signal
$S_{fb}$ Feedback signal
$S_i$ First phase reference signal
$S_q$ Second phase reference signal
$S_{M,out}$ First clock signal
$S_{S,out}$ Second clock signal
$\Phi_{ref}$ Reference clock phase
$\Phi_{fb}$ Feedback phase
$\Phi_i$ First phase reference phase
$\Phi_q$ Second phase reference phase
X Correction signal
Y First control signal
Z Second control signal

What is claimed is:

1. A digital control loop for clock generation, comprising:
   at least one phase detector which has at least one reference clock signal input for receiving a reference clock signal, a feedback input for receiving a feedback signal and a correction signal output, the phase detector being configured to detect a phase shift of the feedback signal relative to the reference clock signal and output at the correction signal output a correction signal on the basis of the phase shift detected;
   at least one control loop filter having a signal connection to the correction signal output of the phase detector via a correction signal input for receiving the correction signal, the control loop filter being configured to output, on the basis of the correction signal, a first control signal via a first control output and a second control signal via a second control output, the first control signal being substantially the same as the second control signal except that oscillations are suppressed in the second control signal;

at least one first phase generator which has at least one control input for receiving the first control signal and at least one first phase reference input for receiving a first phase reference signal, wherein the first phase generator is configured to output a first clock signal via a first clock signal output on the basis of the first control signal and the first phase reference signal, wherein the first clock signal output has a signal connection to the feedback input of the phase detector and the first clock signal is transmitted at least partially as feedback signal to the phase detector; and at least one second phase generator which has at least one control input for receiving the second control signal and at least one first phase reference input for receiving the first phase reference signal, wherein the second phase generator is functionally substantially the same as the first phase generator and is configured to output a second clock signal via a second clock signal output on the basis of the second control signal and the first phase reference signal.

2. The control loop of claim 1, wherein the phase detector is configure to output a binary correction signal.

3. The control loop of claim 1, wherein the first and the at least one second phase generator are structurally the same.

4. The control loop of claim 1, wherein the reference clock signal is received as the first phase reference signal by the first and by the at least one second phase generator.

5. The control loop of claim 1, wherein:
the first phase generator comprises at least one first delay line configured for generating the first clock signal at least partially by delaying the first phase reference signal by a phase determined by means of the first control signal; and
the at least one second phase generator each comprises at least one second delay line configured for generating at least one second clock signal at least partially by delaying the first phase reference signal by a phase determined by means of the second control signal.

6. The control loop of claim 1, wherein at least one of the first and second clock signal output comprises a multiplicity of parallel phase outputs and the first and second clock signal, respectively, comprises a multiplicity of essentially periodic phase signals in such a manner that the individual phase signals are shifted with respect to one another by a phase difference and each phase signal is output via a phase output.

7. The control loop of claim 6, wherein:
the first phase generator comprises at least one first delay line configured for generating the first clock signal at least partially by delaying the first phase reference signal by a phase determined by means of the first control signal; and
the at least one second phase generator each comprises at least one second delay line configured for generating at least one second clock signal at least partially by delaying the first phase reference signal by a phase determined by means of the second control signal.

8. The control loop of claim 7, wherein the first and the at least one second phase generator each comprise a second phase reference input for receiving a second phase reference signal; and wherein:
the first phase generator comprises at least one first phase interpolator configured to generate the first clock signal in such a manner that the phase of the first clock signal is at an angle, determined by the first control signal, between the phases of the first and the second phase reference signal; and
the second phase generator comprises at least one second phase interpolator configured to generate the second clock signal in such a manner that the phase of the second clock signal is at an angle, determined by second control signal, between the phases of the first and the second phase reference signal.

9. The control loop of claim 1, wherein the first and the at least one second phase generator each comprise a second phase reference input for receiving a second phase reference signal; and wherein:
the first phase generator comprises at least one first phase interpolator configured to generate the first clock signal in such a manner that the phase of the first clock signal is at an angle, determined by the first control signal, between the phases of the first and the second phase reference signal; and
the second phase generator comprises at least one second phase interpolator configured to generate the second clock signal in such a manner that the phase of the second clock signal is at an angle, determined by second control signal, between the phases of the first and the second phase reference signal.

10. The control loop of claim 1, wherein the control loop filter comprises:
at least one latch device with a data input for receiving the first control signal, a data output for outputting the second control signal, and an activation input for receiving an activation signal, by means of which the latch device is placed into one of an activated state and a deactivated state, wherein the latch device
outputs the first control signal in the activated state; and
outputs the value of the first control signal before deactivation of the latch device in the deactivated state as the second control signal at the data output; and
at least one oscillation detector configured for detecting oscillations of the correction signal and outputting at a detector output, one the basis of the oscillations detected, a detection signal which is transmitted to the latch device as activation signal.

11. A method for clock generation comprising the following steps:
providing a reference clock signal;
detecting a phase shift between the reference clock signal and a feedback signal;
generating a correction signal on the basis of the phase shift detected;
generating at least one first control signal and at least one second control signal in dependence on the correction signal, wherein the at least one second control signal is substantially the same as the first control signal and differs from the first control signal in that oscillations are suppressed in the at least one second control signal;
providing at least one first phase reference signal;
generating a first clock signal, the phase of which, relative to the phase of the first phase reference signal, depends on the first control signal; and generating at least one second clock signal, the phase of which, relative to the phase of the first phase reference signal, depends on the second control signal.

12. The method of claim 11, wherein the steps of generating the first clock signal and the second clock signal are carried out in substantially the same way.

13. The method of claim 11, wherein a clock signal of a digital circuit is provided as reference clock signal.

14. The method of claim 11, wherein the correction signal is generated as a binary signal.

15. The method of claim 11, wherein the reference clock signal is used as first phase reference signal.

16. The method of claim 11, wherein at least one of the first and the second clock signal comprise a multiplicity of essentially periodic phase signals in such a manner that the individual phase signals are shifted with respect to one another by a certain or determinable phase difference and each phase signal is output on a separate phase line.

17. The method of claim 11, wherein the first and at least one second clock signal, respectively, is at least partially generated by delaying the first phase reference signal by means of a first and at least one second delay line, respectively, by a phase determined by means of the first and second control signal, respectively.

18. The method of claim 11, further comprising providing at least one second phase reference signal, wherein the first and the at least one second clock signal is generated by means of a first and at least one second phase interpolator, respectively, in such a manner that its phase is at an angle, determined by the first and second control signal, respectively, between the phases of the first and the second phase reference signal.

19. The method of claim 11, further comprising:
detecting oscillations of the correction signal;
transmitting an activation signal to a latch device on the basis of the detected oscillations,
wherein, in the step of generating the second clock signal, the first control signal is transferred to the latch device and the latch device is placed into an one of an activated state and a deactivated state on the basis of the activation signal, wherein the latch device
outputs the first control signal directly in the activated state and
outputs the value of the first control signal before deactivation of the latch device in the deactivated state as second clock signal.

20. A digital control loop for clock generation, comprising:
at least one phase detector configured to detect a phase shift of a feedback signal relative to a reference clock signal and output a correction signal on the basis of the phase shift detected;
at least one control loop filter configured to output, on the basis of the correction signal, a first control signal and a second control signal, the first control signal being substantially the same as the second control signal except that oscillations are suppressed in the second control signal;
at least one first phase generator configured to output a first clock signal on the basis of the first control signal and the first phase reference signal, wherein the first clock signal is transmitted at least partially as feedback signal to the phase detector; and
at least one second phase generator configured to output a second clock signal on the basis of the second control signal and the first phase reference signal.

* * * * *